US012749721B2

(12) United States Patent
Hibbard et al.

(10) Patent No.: US 12,749,721 B2
(45) Date of Patent: Sep. 29, 2026

(54) SOLID-STATE BATTERY MANAGEMENT SYSTEM FOR HIGH CURRENT APPLICATIONS

(71) Applicant: Ford Global Technologies, LLC, Dearborn, MI (US)

(72) Inventors: Michael Hibbard, Long Beach, CA (US); Anil Paryani, Cerritos, CA (US); Andrew Almendares, Long Beach, CA (US); Mohit Chand, Santa Fe Springs, CA (US); Jiaqi Liang, La Crescenta, CA (US); Yoganand Parthasarathy, Bangalore (IN)

(73) Assignee: Ford Global Technologies, LLC, Dearborn, MI (US)

( * ) Notice: Subject to any disclaimer, the term of this patent is extended or adjusted under 35 U.S.C. 154(b) by 665 days.

(21) Appl. No.: 18/032,068

(22) PCT Filed: Oct. 19, 2021

(86) PCT No.: PCT/US2021/055657
§ 371 (c)(1),
(2) Date: Apr. 14, 2023

(87) PCT Pub. No.: WO2022/086998
PCT Pub. Date: Apr. 28, 2022

(65) Prior Publication Data

US 2023/0395876 A1 Dec. 7, 2023

Related U.S. Application Data

(60) Provisional application No. 63/093,647, filed on Oct. 19, 2020.

(51) Int. Cl.
*H02J 7/00* (2026.01)
*B60L 3/00* (2019.01)
(Continued)

(52) U.S. Cl.
CPC ......... *H01M 10/425* (2013.01); *B60L 3/0046* (2013.01); *B60L 3/0092* (2013.01);
(Continued)

(58) Field of Classification Search
CPC ........ B60L 58/10; B60L 58/26; B60L 3/0046; B60L 3/0092; H01M 10/425;
(Continued)

(56) References Cited

U.S. PATENT DOCUMENTS

2007/0230229 A1 10/2007 Bryan et al.
2008/0006902 A1 1/2008 Chakravarti et al.
(Continued)

OTHER PUBLICATIONS

International Search Report, Jan. 18, 2022, 1 page.
Written Opinion of the International Searching Authority, Jan. 18, 2022, 4 pages.

*Primary Examiner* — Zixuan Zhou
(74) *Attorney, Agent, or Firm* — Enable IP, P.C.

(57) ABSTRACT

A Battery Management System (BMS) integrating solid-state relay and current shunt sensor on a single printed circuit board assembly (PCBA), in lieu of traditional electro-mechanical contactors and fuses and external current sensor, is disclosed. The associated monitoring, driving, protection and energy clamping circuitries, and thermal management design to enable high-current and safety-critical applications are also disclosed.

12 Claims, 11 Drawing Sheets

(51) Int. Cl.

| | |
|---|---|
| ***B60L 58/10*** | (2019.01) |
| ***B60L 58/26*** | (2019.01) |
| ***G01R 31/3828*** | (2019.01) |
| ***H01M 10/42*** | (2006.01) |
| ***H02H 3/087*** | (2006.01) |
| ***H02H 5/04*** | (2006.01) |

(52) U.S. Cl.
CPC ............... *B60L 58/10* (2019.02); *B60L 58/26* (2019.02); *G01R 31/3828* (2019.01); *H02H 3/087* (2013.01); *H02H 5/04* (2013.01); *H01M 2010/4271* (2013.01)

(58) Field of Classification Search
CPC . H01M 2010/4271; H02H 3/087; H02H 5/04; G01R 31/3828
USPC .......................................................... 320/127
See application file for complete search history.

(56) References Cited

U.S. PATENT DOCUMENTS

| | | | | |
|---|---|---|---|---|
| 2010/0213900 | A1 | 8/2010 | Carrier et al. | |
| 2016/0240471 | A1* | 8/2016 | Klowak | H01L 23/4824 |
| 2017/0025872 | A1* | 1/2017 | Kang | B60L 3/0046 |
| 2017/0366036 | A1 | 12/2017 | Verma | |
| 2018/0083435 | A1 | 3/2018 | Redler | |
| 2018/0093569 | A1 | 4/2018 | Takao et al. | |
| 2018/0309308 | A1* | 10/2018 | Saito | H02J 7/663 |

* cited by examiner

SOLID-STATE BATTERY MANAGEMENT SYSTEM FOR HIGH CURRENT APPLICATIONS

CROSS-REFERENCE TO RELATED APPLICATION

This application claims priority to U.S. Provisional Patent Application Ser. No. 63/093,647, filed on Oct. 19, 2020, the disclosure of which is hereby incorporated by reference in its entirety.

FIELD

This relates to a Battery Management System (BMS) of a vehicle, and in particular, to a BMS integrating solid-state relay and current shunt sensor on a single printed circuit board assembly (PCBA).

BACKGROUND

Typically, a BMS uses a contactor (or electro-mechanical switch) and a fuse to disconnect the battery from the source and load. The contactor and fuse are usually capable of conducting high current and withstanding high transient voltage. However, they are bulky, expensive, and less reliable. They usually require extra interfacing bus bars and wiring (connector and crimping), which is unreliable especially for high-vibration e-mobility applications. Being mechanical or thermally actuated devices, contactors and fuses have a slow and uncertain response time, often leading to contactor welds and false fuse blow, which make them less safe.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to automotive systems, some of which are illustrated by way of example in the figures and in the following description of the preferred aspects. The detailed description and drawings are merely illustrative of the disclosure rather than limiting, the scope of the disclosure being defined by the appended claims and equivalents thereof.

Some BMS's do use solid-state field-effect transistors (FETs), for lower current applications typically <30 A, e.g. scooters and e-bikes. A common drain arrangement of FET array is often done because the supply for the gate drive circuit is simpler. Specialized application-specific integrated circuits (ASICs) like the bq76200 exist and are commonly used to drive FETs in this common-drain configuration.

Using solid-state FETs, for up to several hundred amps of high current BMS applications, faces challenges of thermal management, connecting and disconnecting high energy source, responding to abnormal condition such as short circuit and overcharge safety. These challenges are addressed by embodiments of the present disclosure.

Figure 1:
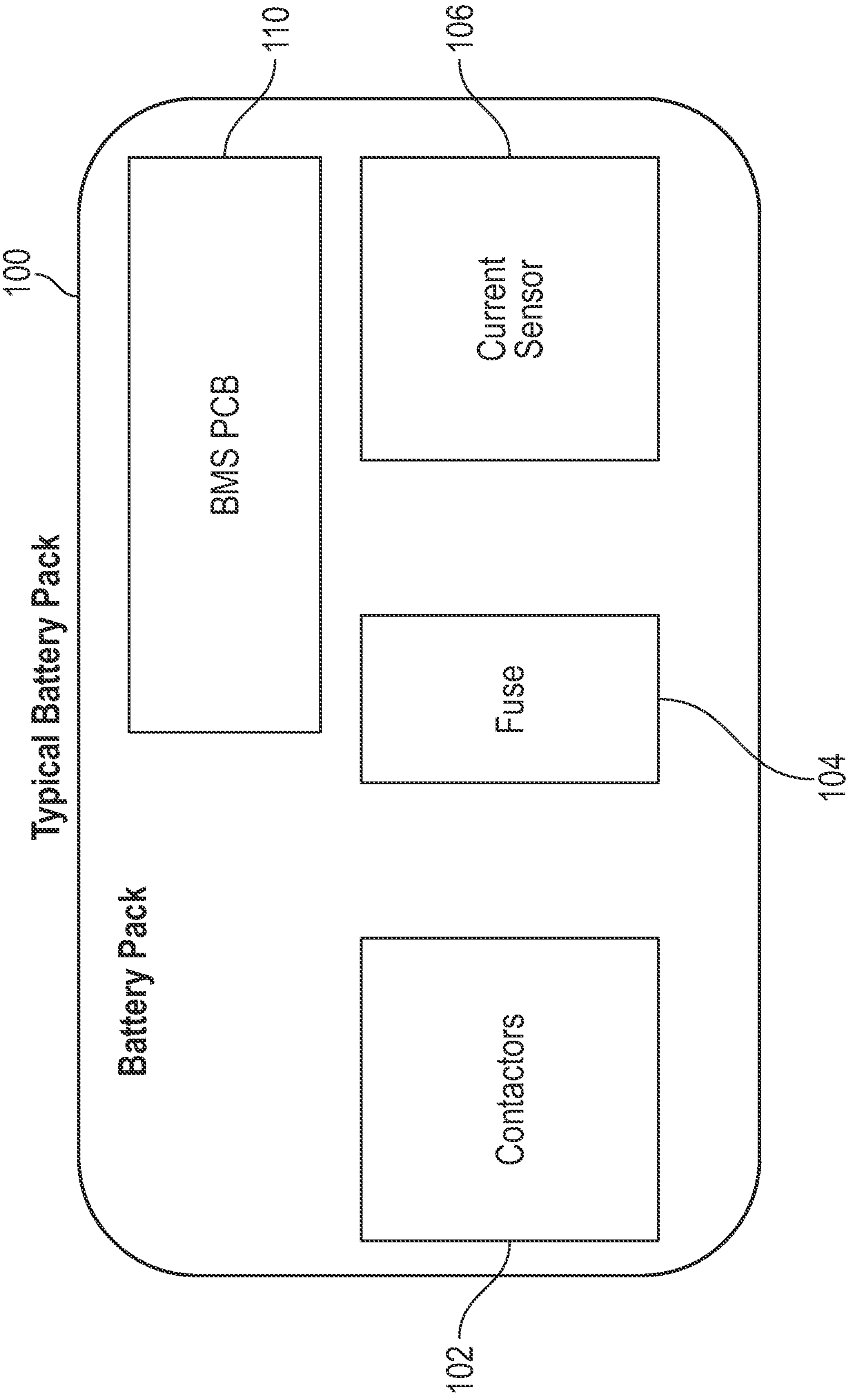
FIG. 1 illustrates a traditional battery pack with separate BMS, contactors, fuse, and current sensor.

In a conventional battery pack 100 illustrated in FIG. 1, contactors 102, fuse 104, and current sensor 106 of the battery pack 100 are not integrated as part of the BMS PCB 110. In some embodiments, this disclosure integrates solid-state FETs, current sensing, and other battery management components to a single BMS PCBA. The associated monitoring, driving, protection, energy clamping circuitries and/or thermal management systems and methods to enable high-current and safety-critical applications are disclosed. These embodiments provide the benefits of making the BMS more efficient, lower cost, smaller and more reliable than the conventional ones. Details of these embodiments are provided below.

Figure 2:
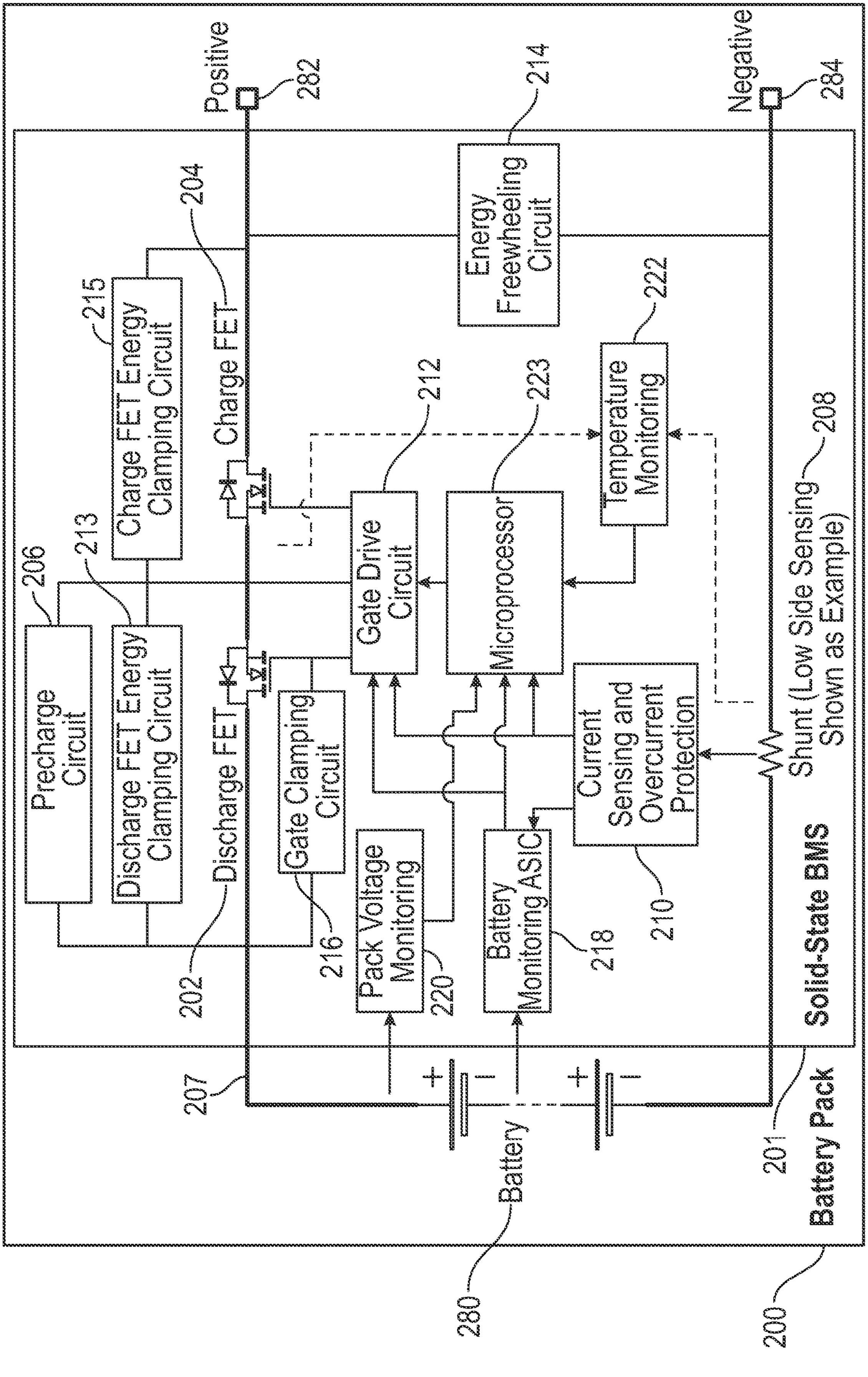
FIG. 2 illustrates an exemplary consolidated battery pack, according to an embodiment of the disclosure, in comparison to a conventional battery pack.

FIG. 2 is a block diagram illustrating the exemplary components and their interconnections of a battery pack 200 including a solid-state BMS 201, according to an embodiment of the disclosure. As illustrated, the disclosed solid-state BMS 201 can integrate Solid-state FETs 202, 204 as resettable fuse, and connecting/disconnecting the battery 280, Solid-state precharge circuit 206 for smooth energizing of external systems connected to battery pack terminals 282, 284, One or more shunt resistors 208 for current sensing, Hardware overcurrent detection circuit 210 and fast gate turn-off circuit 212 for ultra-fast interruption of short circuit fault current, Energy clamping circuits 213, 215 and freewheeling circuits 214 for safely dissipating inductive energy during FET turn-off, Gate clamping circuit 216 across drain and gate of FET to utilize FET's safe operating area (SOA) and limit inductive voltage spike during fast turn-off, Battery monitoring ASIC 218 and separate pack voltage monitoring 220 for redundant overcharge, overvoltage, and undervoltage detection, Temperature monitor 222 to detect FET or shunt overheat, and for temperature compensation to achieve a higher shunt current sensing accuracy FIGS. 3-13 provides a closer view of some of the above-referenced components of FIG. 2. The functions of each of these components and the overall solid-state BMS 201 of FIG. 2 will be explained in detail in the paragraphs below.

Figure 3:
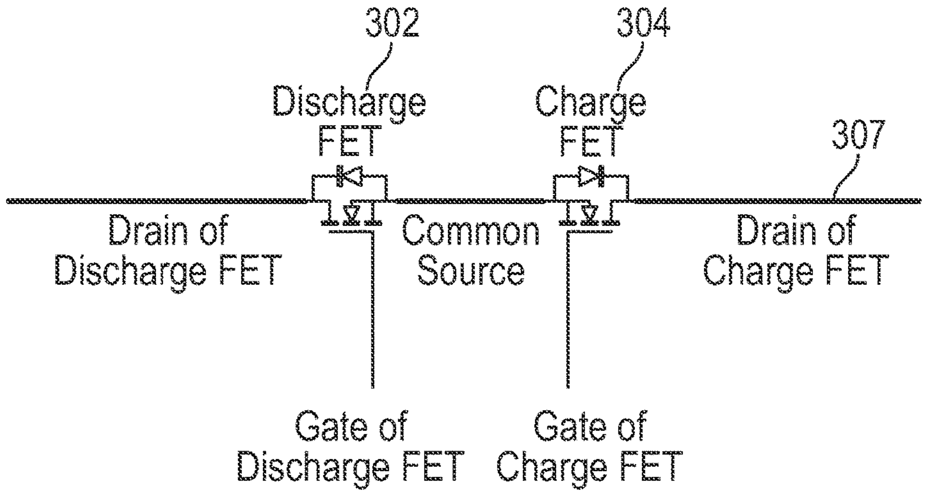
FIG. 3 illustrates an exemplary common source schematic of power transistors (e.g., FETs), according to an embodiment of the disclosure.

FIG. 3 provides an enhanced illustration of the solid-state FETs 302, 304, namely the charge FET 204 and the discharge FET 202 of FIG. 2. As illustrated, the charge FET 304 and the discharge FET 302 are connected in series with the battery (280 in FIG. 2, not shown in FIG. 3), in a back-to-back configuration to have bidirectional current conduction and voltage blocking capability. By turning on and off these FETs 302, 304, the battery can be controlled to connect and disconnect from the external systems such as motor inverters and on-board chargers.

Figure 4:
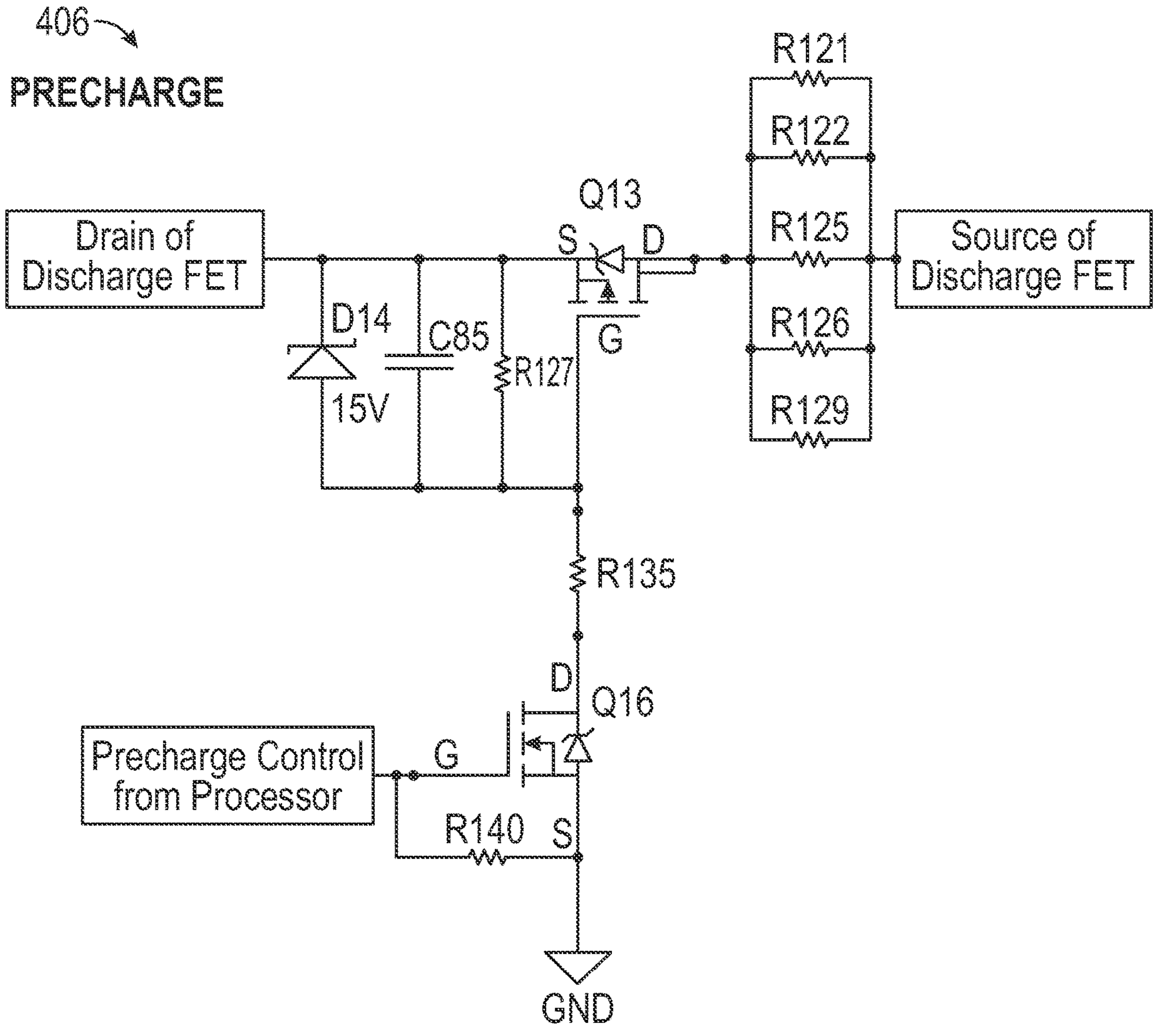
FIG. 4 illustrates an exemplary solid-state precharge circuit schematic, according to an embodiment of the disclosure.

FIG. 4 is a circuit diagram illustrating an exemplary schematics of a solid-state precharge circuit 406 (or precharge circuit 206 of FIG. 2), according to an embodiment of the disclosure. The solid state precharge circuit 206 can be used to safely energize the external systems with a limited current flow. One method of solid-state precharge can be achieved through a precharge FET Q13 and a set of resistors R121, R122, R125, R126, and R129. The resistors R121, R122, R125, R126, and R129 function as current limiting elements, and the precharge FET Q13 functions as an on & off switching.

Figure 5:
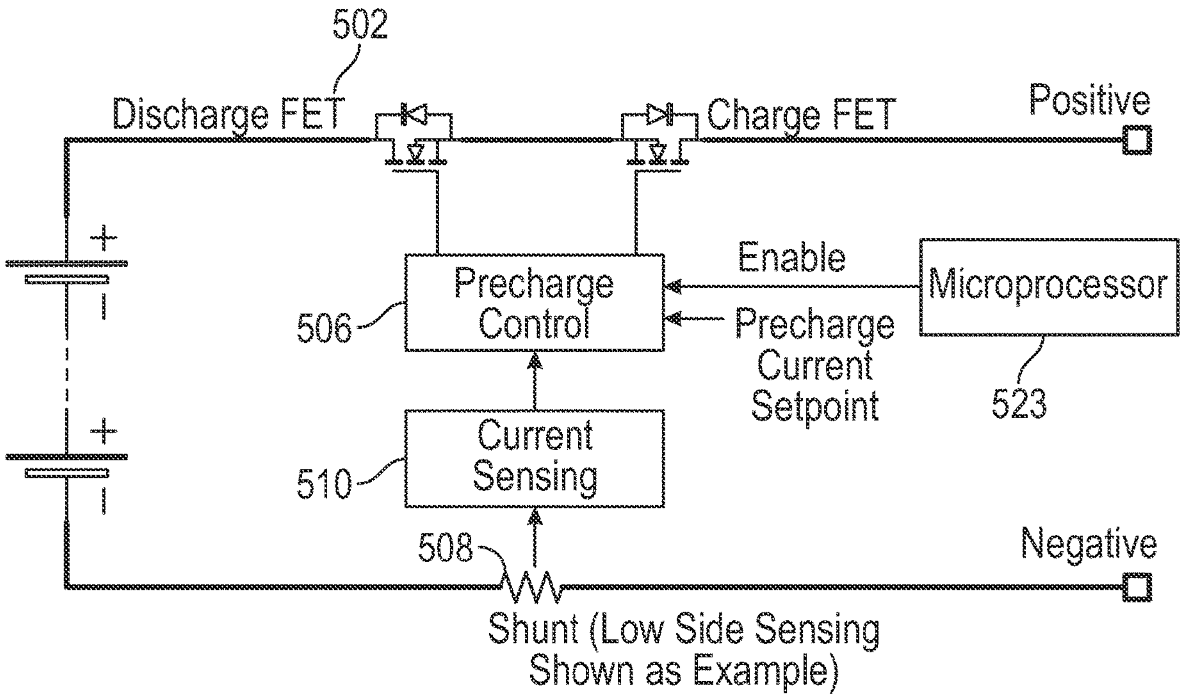
FIG. 5 illustrates an exemplary solid-state precharge method using discharge FET, according to an embodiment of the disclosure.

Another method of solid-state precharge illustrated in FIG. 5 is by partially turning on the discharge FET 502, and operating it in a current limiting mode. This can be achieved by the current sensing unit 510 measuring the battery discharge current (using the onboard current sensing shunt 508), the precharge control unit 506 comparing the measurement with a precharge current setpoint and adjusting the discharge FET gate voltage to limit the precharge current. The precharge control unit 506 can be enabled by microprocessor 523. If during the precharge operation, the external bus voltage rise is slower than normal, then a precharge fault is detected and precharge operation is terminated.

Regarding the FET thermal management for high power applications, the drain pin of a typical metal-oxide-semiconductor field-effect transistor (MOSFET) has a lower thermal resistivity path to the copper in the circuit board, compared to the source connection of a MOSFET. This is due to the drain being a direct connection to the silicon substrate, w % bile the source connection is made through small bond wires. To reduce FET temperature rise for high current application, a large copper layer 1202 (see FIG. 12) connected to the FETs' drain connection is employed with vias to cool the devices to the surrounding air by free convection. In additional, metal clad or metal core PCBs can be used for better heat transfer and heat spreading into a larger surface area.

The back-to-back connection of the discharge FET and the Charge FET can be arranged in either a common drain, or a common source configuration. A common-drain configuration results in the FETs' drain pins stay local inside the PCB and no direct path to conduct heat out of the FETs' drain connections. A common-source configuration, as illustrated in FIG. 3, allows better conductive heat sinking from the charge FETs' 304 drain pins to the external cables 307, and conductive heat sinking from the discharge FETs' 302 drain pins to the batteries which have a large thermal mass. This common-source configuration allows further reduction of FET temperature rise and therefore fewer FETs are needed compared to a common-drain design.

Gate driver for FETs used on a low-current BMS is typically designed to have a slow turn-on or turn-off characteristics, typically in 10s of micro-seconds (e.g., BMS gate drive ASIC BQ76200). This slow current turn-off reduces the inductive voltage spikes and electromagnetic interference, while using the FET silicon die's safety operating area (SOA) and thermal mass to absorb the cable inductive energy. While it works well for low current applications, typical FET's SOA or avalanche energy is not capable of handling current of hundreds or thousands of amps seen in high current BMS, especially during short circuit conditions.

Figure 6:
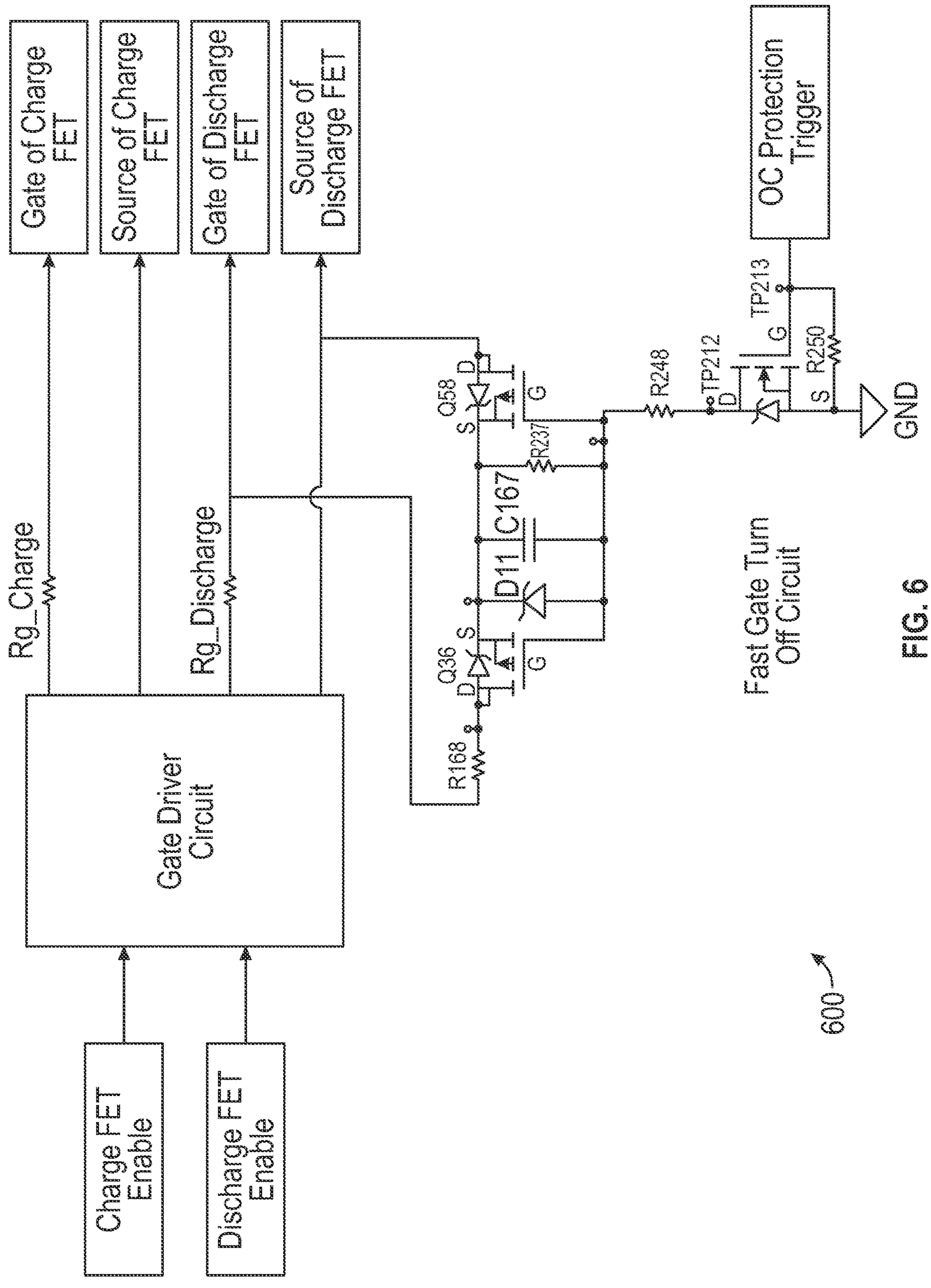
FIG. 6 illustrates an exemplary gate fast turn-off circuit schematic, according to an embodiment of the disclosure.

In one embodiment of this disclosure, a fast gate turn-off circuit 600 illustrated in FIG. 6 is used as an augmentation to the normal slow gate drive circuit. When overcurrent is detected, the fast gate turn-off circuit 600 discharges the FETs' gate capacitance in a micro-second, thus turning off the short circuit current before it reaches any detrimentally large level. This can substantially reduce the inductive energy that needs to be absorbed.

Figure 7:
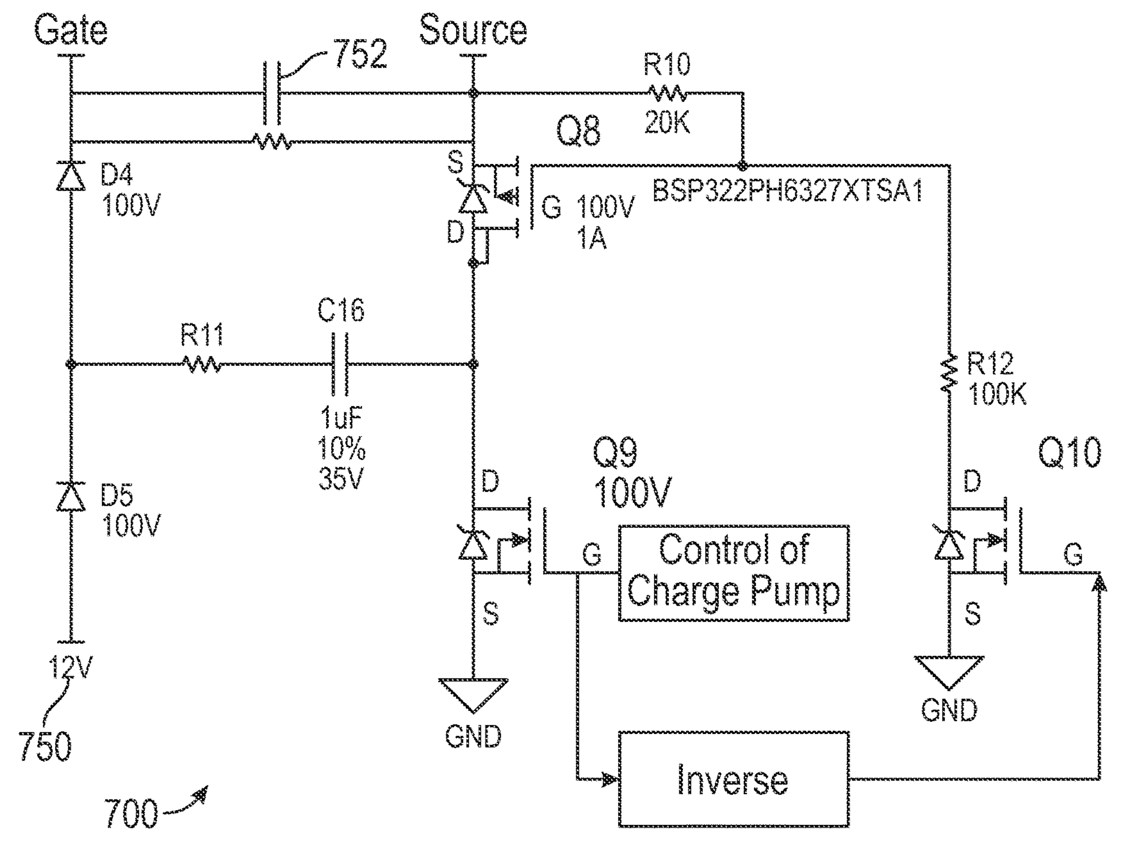
FIG. 7 illustrates an exemplary gate drive circuit, according to an embodiment of the disclosure.

A new low-cost H-bridge charge pump gate drive circuit 700, illustrated in FIG. 7, can be used to slowly turn on or off the back-to-back common-source FETs. The charge pump capacitor, C16, is connected to the board power supply circuit, "12V" 750, and the FET gate-source capacitor 752 alternatively, by controlling the ON/OFF of Q9 and Q10. Thus delivering voltage to the gate when turn on is commanded.

Referring back to FIG. 2, Energy clamping circuits 213, 215 are connected in parallel to the FETs 202, 204. The fast gate turn-off can create a large inductive voltage spike exceeding the FETs' voltage rating, the energy clamping circuits 213, 215 can provide an alternate current path as FETs 202, 204 turn off. This energy clamping circuit 213, 215 can be implemented by one or multiple of, for example, transient voltage suppression (TVS) diodes 850, 852 such as the one illustrated in FIG. 8, resistor-capacitor-diode (RCD) snubbers 848, or metal-oxide varistors (MOVs). To increase energy rating of TVS diode clamping circuits, multiple TVS diode are connected in series to increase the total current and voltage ratings and avoid single point failure for high power applications.

Figure 8:
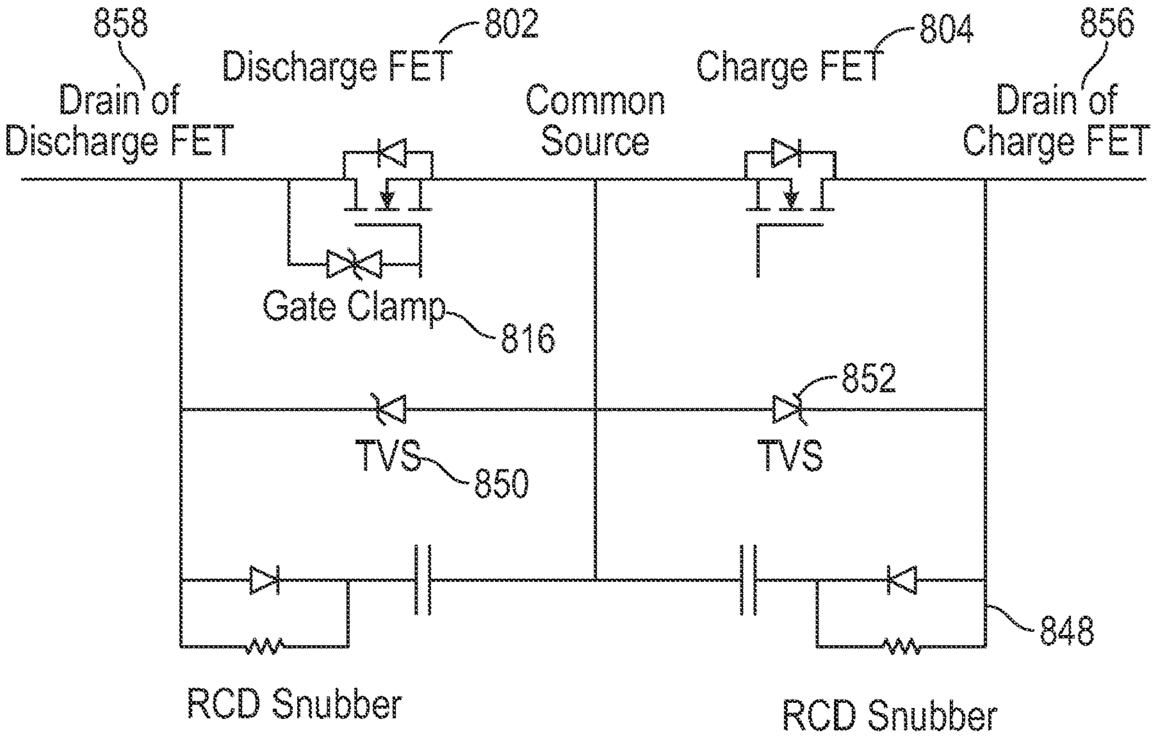
FIG. 8 an exemplary energy clamping and gate clamping schematics, according to an embodiment of the disclosure.

To reduce energy sizing of the energy clamping circuits 848, 850, 852, an additional gate clamping device, e.g., TVS 816, can be put across the drain 858 and gate of the FETs, as illustrated in FIG. 8. The energy clamping and gate clamping circuits are sized such that when a worst case short-circuit happens, the FETs 802, 804 can participate into the inductive energy absorption. As the voltage across the FET 802, 804 and energy clamping circuit 848, 850, 852 exceeds the breakdown voltage of the gate clamping circuit 816, the gate clamping circuit 816 will inject gate current to partially keep the FETs 802, 804 in the active region and slow down the FET turn-off.

Referring again to FIG. 2, to reduce energy sizing the energy clamping circuits 213, 215, an additional energy freewheeling circuit 214, as shown in FIG. 2, can also be implemented across the BMS 201 output positive and negative terminals 282, 284. An example implementation can be achieved by passive Schottky diodes.

Current sensing shunt (e.g., 208 in FIG. 5) can be integrated to the same BMS PCBA. A low-side (connected to the battery negative terminal) shunt is used to measure current, as it is easy to bias an amplified signal to ground using a differential amplifier circuit such as the one illustrated in FIG. 10. However, a low-side shunt requires battery negative return current to pass through the PCBA. This creates more thermal load to the BMS PCBA.

Figure 9:
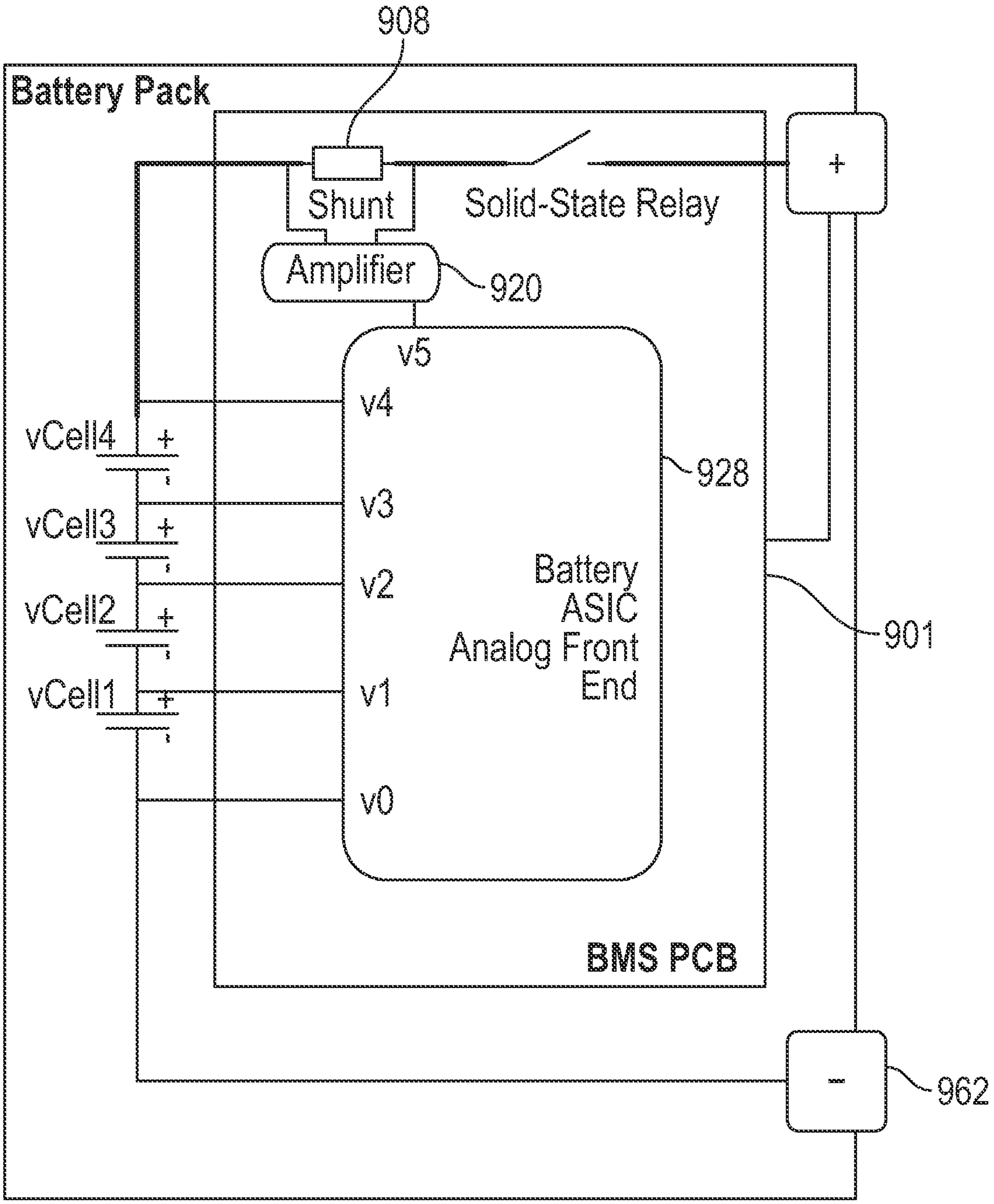
FIG. 9 illustrates an exemplary high side shunt, according to an embodiment of the disclosure.
Figure 10:
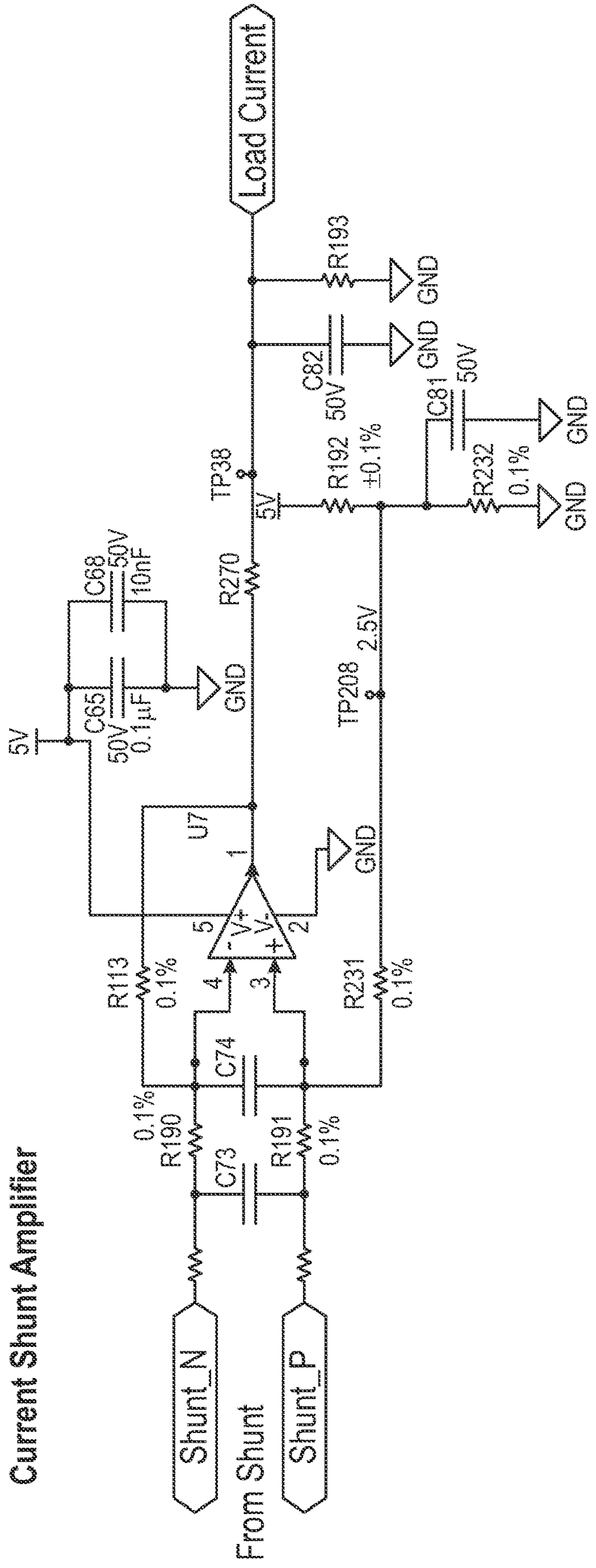
FIG. 10 an exemplary shunt amplifier for low side shunt, according to an embodiment of the disclosure.

A high-side (connected to the battery positive terminal) shunt 908 of FIG. 9 can also be employed to reduce cost and decrease packaging size. The battery negative terminal return current now doesn't need to pass through the PCB 901, which eliminates the high current board connector on the negative side 962. The typical downside of the high side shunt 908 is measurement accuracy. To overcome this drawback, an amplifier 920 with high common-mode voltage rejection capability can be used to interface with the high-side shunt 908, before feeding the current measurement signal to a standard battery monitoring ASIC 928 for accurate current sampling.

Figure 12:
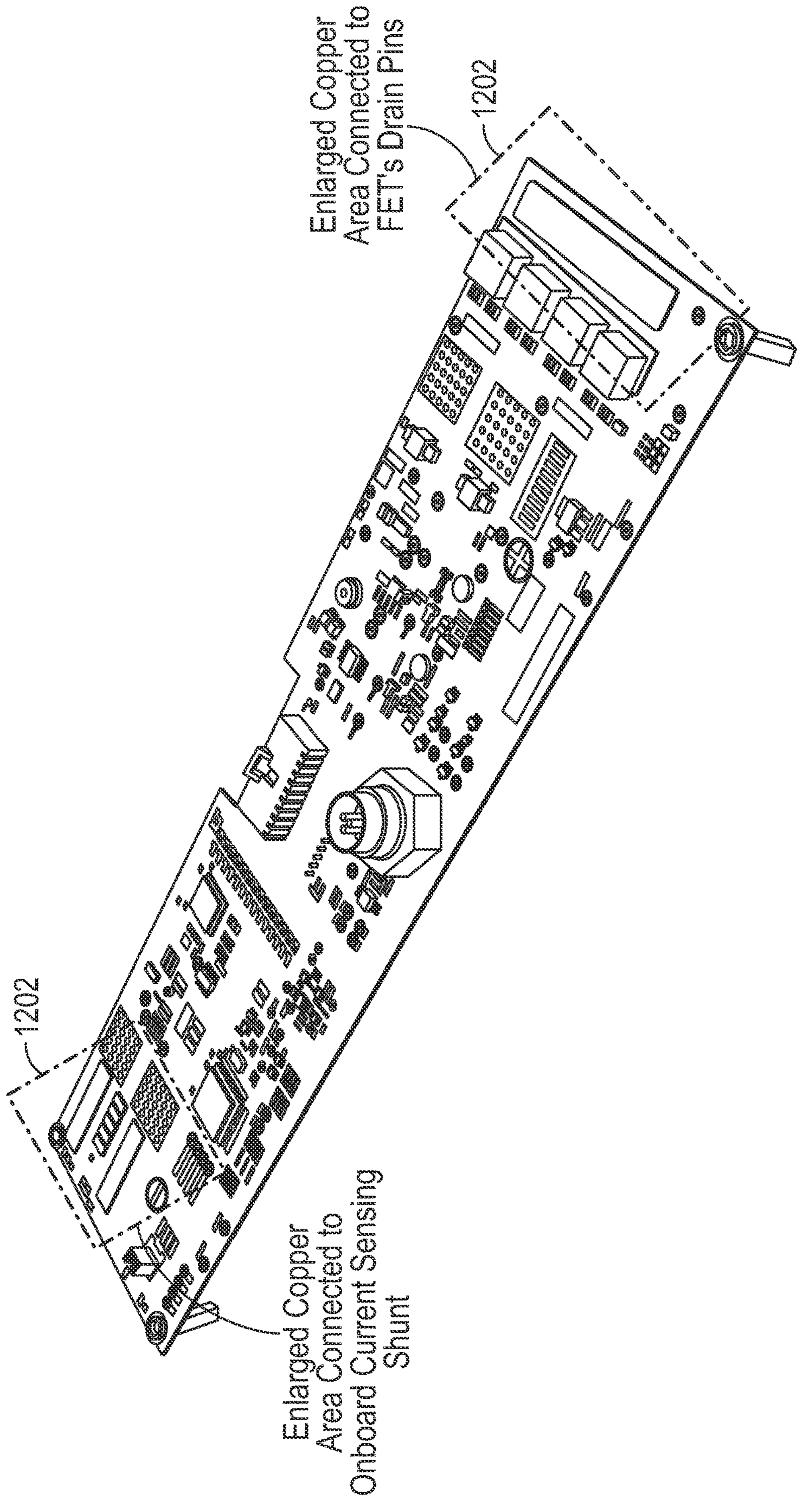
FIG. 12 illustrates an exemplary technique of thermal dissipation using PCB copper pads and vias, according to an embodiment of the disclosure.
Figure 13:
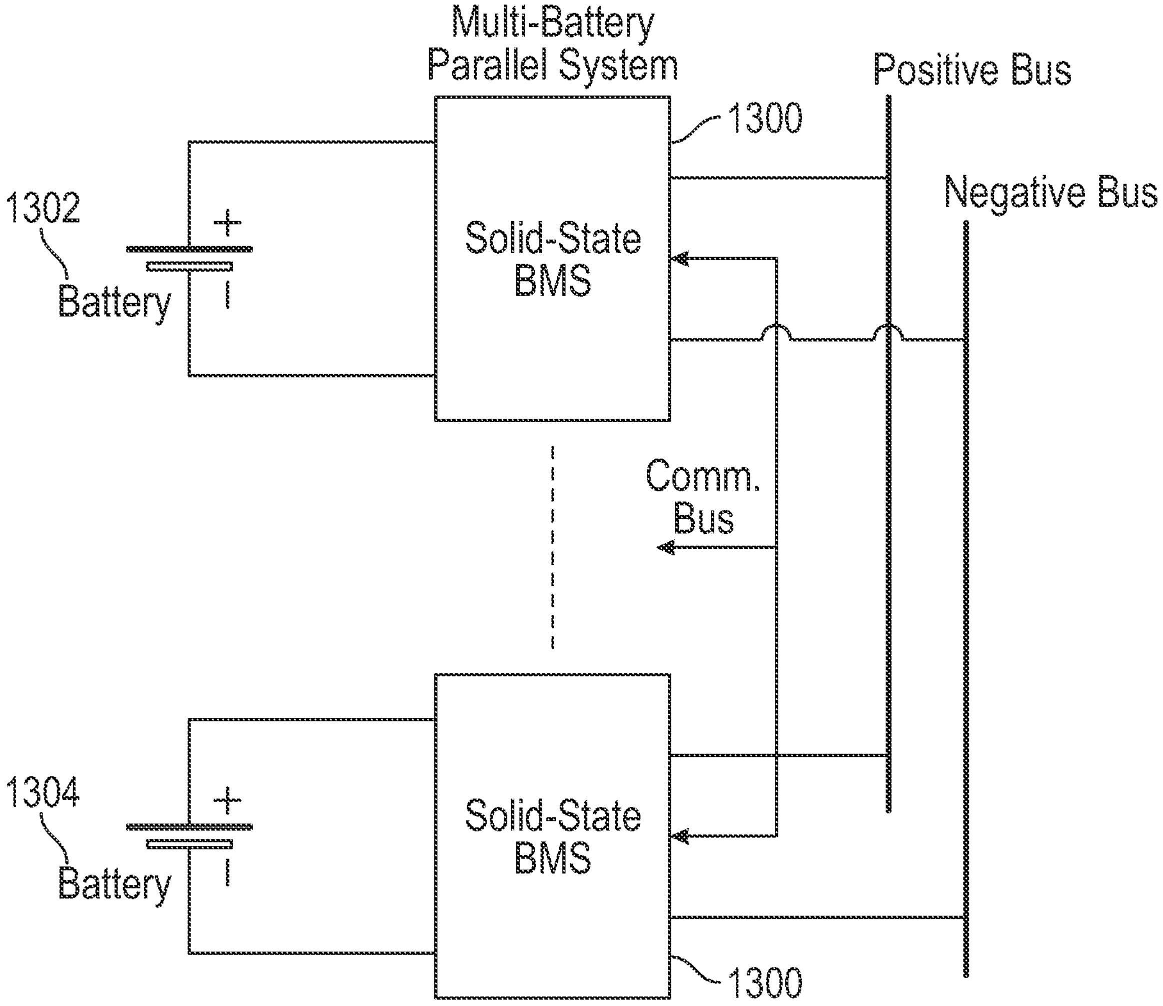
FIG. 13 illustrates an exemplary parallel configuration of using solid state BMS, according to an embodiment of the disclosure.

To dissipate heat generated from the shunt, a large copper layer 1202 is employed with vias to cool the devices to the surrounding air by free convection, as illustrated in FIG. 12.

Figure 11:
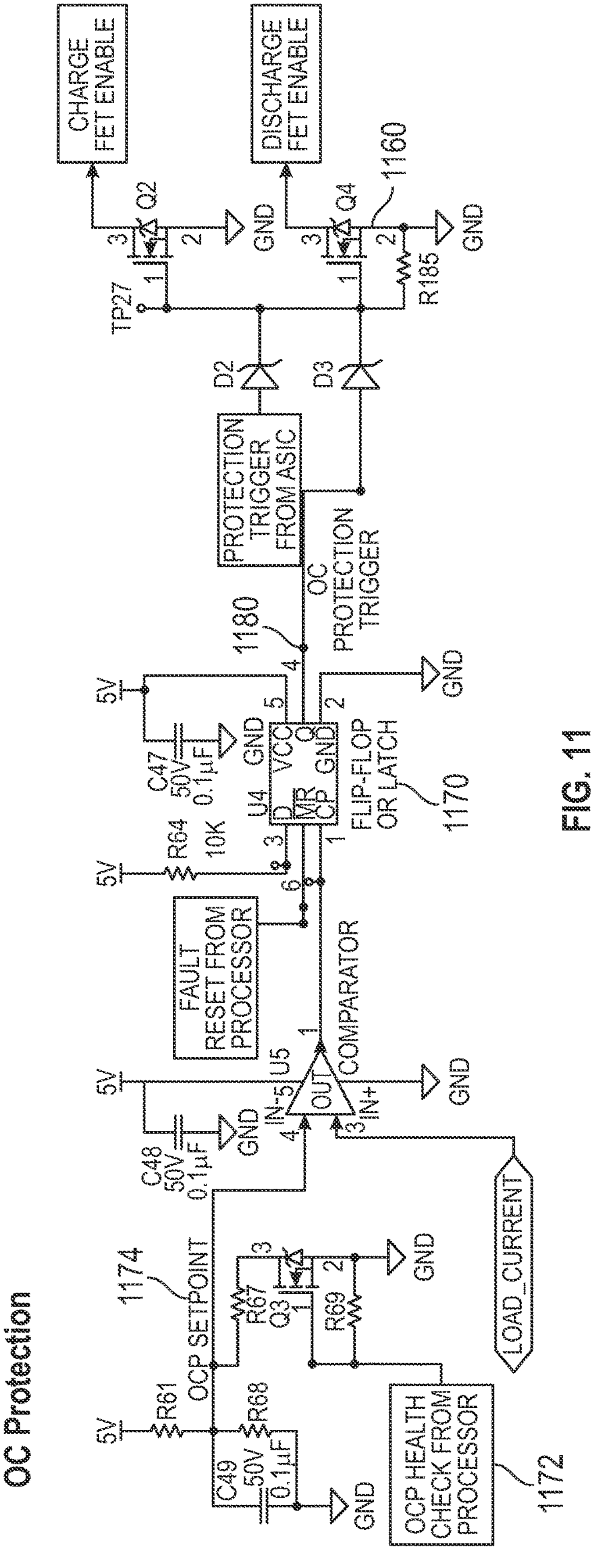
FIG. 11 illustrates an exemplary HW over-current detection circuit, according to an embodiment of the disclosure.

Overcurrent protection (OCP) can be implemented via exemplary hardware comparator and flip-flop circuits shown in FIG. 11. This hardware implementation allows low latency battery short-circuit fault detection, and improves safety without microprocessor software intervention. A hardware resistor divider circuit is used to define the OCP setpoint 1174. Once the measured current exceeds the OCP setpoint 1174, the hardware OCP flip-flop 1170 is set, the OCP trigger signal 1180 is fed to the gate driver and gate fast turn-off circuit 1160 to quickly turn off the discharge FET. To achieve a high safety integrity level, an OCP circuit health status check 1172 is implemented by pulling down the OCP trigger setpoint 1174 each time before turning on the BMS discharge FET. Certain applications may require the OCP setpoint 1174 to be adjustable based on the BMS diagnostics of the battery conditions. To achieve a software adjustable OCP setpoint 1174, the microprocessor can pulse-width modulate the health status check input to lower the OCP setpoint 1174 from the default hardware OCP setpoint.

Referring again to FIG. 2, a redundant overcurrent detection is implemented via the battery monitoring ASIC 218 or microprocessor 223. Once overcurrent is detected by the battery monitoring ASIC 218 or microprocessor 223, a turn-off command is sent to the gate drive circuitries 212. This redundancy provides a higher functional safety level.

Over-voltage and under-voltage can also be detected by redundant means. The battery monitoring ASIC 218 can monitor the voltage of individual battery cell without software intervention, while the microprocessor 223 and pack voltage sensing circuit 220 monitor the voltage of the entire battery pack 200. If abnormal voltage, e.g., due to overcharge, is detected by either the battery monitoring ASIC 218 or microprocessor 223, a turn-off command is sent to the gate drive circuitries 212 (see FIG. 2).

Temperature monitoring circuits 222 further protects the FETs 202, 204 and shunt 208 from over-temperature due to high current load (FIG. 2). For example the temperature monitoring circuits can include a surface mount thermistor that is thermally coupled to the FETs 202, 204 and current sensing shunt 208 via a low impedance path through a PCB trace. Typically. PCB thermistors reflect ambient temperature. By running large copper planes underneath the surface mounted FET 202, 204 or shunt 208 and thermistors, the thermistor's temperature is now tightly coupled to the FET's and shunt's temperature. The thermistor can be connected via a standard comparator to the processor 223 to take very fast action. This allows the software to detect any unexpected thermal rise and open FETs 202, 204 ensuring further reliability and safety from an unusual event.

The shunt temperature measurement can also be used for current measurement gain correction. To improve the battery State of Charge estimation accuracy, the thermistor next to a shunt is used to compensate for temperature coefficient of the shunt.

Multiple battery packs 1302, 1304 can be connected in parallel (FIG. 13) safely and reliably with the solid-state BMS described in the above embodiments of this disclosure, allowing a system to have scalable energy capacity. The solid-state BMS 1300 significantly reduces the response time to short-circuit fault current interruption. As a result, the system energy and power capacity can be easily increased without increase in the short circuit current stress to the rest of the system components.

In one aspect of the disclosure, a system of solid-state precharge by measuring the battery discharge current and adjusting the gate voltage of the discharge FET to limit the precharge current is disclosed. The system of fast overcurrent protection can include a hardware overcurrent setpoint circuit, a hardware overcurrent detection circuit, and a fast gate turn-off circuit to the power transistors. In one embodiment, the overcurrent setpoint circuit can include an input from microprocessor to lower the overcurrent setpoint based on software, for checking the health of hardware overcurrent detection circuit and reducing the overcurrent protection threshold based on BMS diagnostics.

In another aspect of the disclosure, a system of safely absorbing the inductive energy during fast turn-off of power transistors is disclosure. The system includes energy clamping circuits connected in parallel to the power transistors. In one embodiment, the energy clamping circuits can include one or multiple of transient voltage suppression (TVS) diodes, resistor-capacitor-diode (RCD) snubbers, or metal-oxide varistors (MOVs). In one embodiment, the TVS diodes can include multiple TVS diodes connected in series to increase the total voltage and current ratings for high power applications.

In yet another aspect of the disclosure, a system of limiting the inductive voltage spike during fast turn-off of power transistors and keeping the power transistor in active region to dissipate the inductive energy is disclosed. The system can include a gate clamping circuit connected across the drain and gate of the power transistors.

In yet another aspect of the disclosure, a system of limiting the inductive energy and suppressing negative voltage spikes generated from external systems is disclosed. The system includes an energy freewheeling circuit connected across the positive and negative output terminals.

In yet another aspect of the disclosure, a system of using a high-side current sensing shunt is disclosed. The system includes shunt resistors connected to the positive side of the battery and an amplifier sensing circuit to reject common-mode voltage of the battery.

In yet another aspect of the disclosure, a system of providing redundant over-current, over-voltage, under-voltage, over-temperature, under-temperature protection to open FETs is disclosed. The system includes hardware or battery monitoring ASIC based protection and microprocessor software-based protection.

In yet another aspect of the disclosure, a system of paralleling battery packs with solid-state BMS is disclosed. The system includes fast reacting short-circuit protection to limit system short-circuit stress.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A battery management system (BMS) printed circuit board assembly (PCBA) for managing a battery comprising:

a plurality of solid-state power transistors in back-to-back serial configuration configured to connect and disconnect the battery, and to function as resettable fuse, a plurality of energy clamping circuits connected in parallel to the plurality of solid-state power transistors, the plurality of energy clamping circuits configured to provide an alternative current path when the plurality of solid-state power transistors are turned off, a gate clamping circuit across a drain and gate of the plurality of solid-state power transistors, the gate clamping circuit configured to inject gate current to partially keep the plurality of solid-state power transistors in an active region and slow down the turn-off of the plurality of solid-state power transistors when a voltage across the plurality of solid-state power transistors and the plurality of energy clamping circuits exceeds a breakdown voltage of the gate clamping circuit, gate drive circuitries configured to turn on and off the solid-state power transistors, one or more shunt resistors configured for current sensing, a battery monitoring application-specific integrated circuit (ASIC), and a microprocessor, wherein the battery monitoring ASIC and the microprocessor are configured to provide redundant overcurrent detection.

2. The BMS PCBA of claim 1, wherein the plurality of solid-state power transistors are arranged in a common source configuration.

3. The BMS PCBA of claim 1, wherein the plurality of solid-state power transistors comprise drain pins connected to large copper pads with vias to cool the solid-state power transistors through surrounding air convection.

4. The BMS PCBA of claim 1 further comprising a metal clad or metal core printed circuit board (PCB).

5. The BMS PCBA of claim 1, wherein the gate drive circuitries comprise of a fast gate turn-off circuit configured to turn off the transistors when responding to an over-current fault.

6. The BMS PCBA of claim 1, wherein the gate drive circuitries comprise of a charge pump circuit configured to turn on and off the solid-state power transistors.

7. The BMS PCBA of claim 1 further comprising a precharge circuit using MOSFET and resistors connected in parallel to one or more of the solid-state power transistors.

8. The BMS PCBA of claim 1 further comprising an energy freewheeling circuit implemented across output positive and negative terminals of the BMS PCBA, the energy freewheeling circuit configured to dissipate inductive energy when the plurality of solid-state power transistors are turned off.

9. The BMS PCBA of claim 1 further comprising a temperature monitor configure to detect an overheating of the plurality of solid-state power transistors and the one or more shunt resistors.

10. The BMS PCBA of claim 9 further comprising one or more copper planes underneath the plurality of solid-state power transistors.

11. The BMS PCBA of claim 9 wherein the temperature monitor comprises a surface mount thermistor that is thermally coupled to the plurality of solid-state power transistors and the one or more shunt resistors via a low impedance path through a printed circuit board (PCB) trace.

12. The BMS PCBA of claim 11, wherein the surface mount thermistor is connected via a standard comparator to the microprocessor.

* * * * *